(12) United States Patent
Sinclair

(10) Patent No.: US 6,422,011 B1
(45) Date of Patent: Jul. 23, 2002

(54) THERMAL OUT-OF-PLANE BUCKLE-BEAM ACTUATOR

(75) Inventor: Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/703,201

(22) Filed: Oct. 31, 2000

(51) Int. Cl.⁷ .............................................. F01B 29/10
(52) U.S. Cl. ......................................... 60/528; 60/527
(58) Field of Search .................................. 60/527, 528

(56) References Cited

U.S. PATENT DOCUMENTS

| | | | |
|---|---|---|---|
| 5,994,816 A | * 11/1999 | Dhuler et al. | 310/307 |
| 6,023,121 A | * 2/2000 | Dhuler et al. | 310/307 |
| 6,130,464 A | * 10/2000 | Carr | 257/417 |

* cited by examiner

*Primary Examiner*—Hoang Nguyen
(74) *Attorney, Agent, or Firm*—Ipsolon LLP

(57) ABSTRACT

An out-of-plane thermal buckle-beam microelectrical mechanical actuator is formed on a planar substrate of semiconductor material (e.g., silicon). The actuator includes first and second anchors secured to the substrate and multiple elongated thermal buckle beams that are secured between the anchors. The buckle beams are formed of semiconductor material, such as polysilicon. In one implementation, the buckling beams are coupled together by a pivot frame that includes a frame base secured to each buckle beam and at least one pivot arm that is coupled to the frame base at one end and includes a free end that pivots out-of-plane when the actuator is activated. A current source directs electrical current through the thermal buckle beams via the anchors to impart thermal expansion of the buckle beams and hence a buckling motion of them out of the plane (i.e., away from) the substrate. Some implementations may include an out-of-plane buckle bias that predisposes the buckle beams to move away from the substrate when activated.

23 Claims, 5 Drawing Sheets

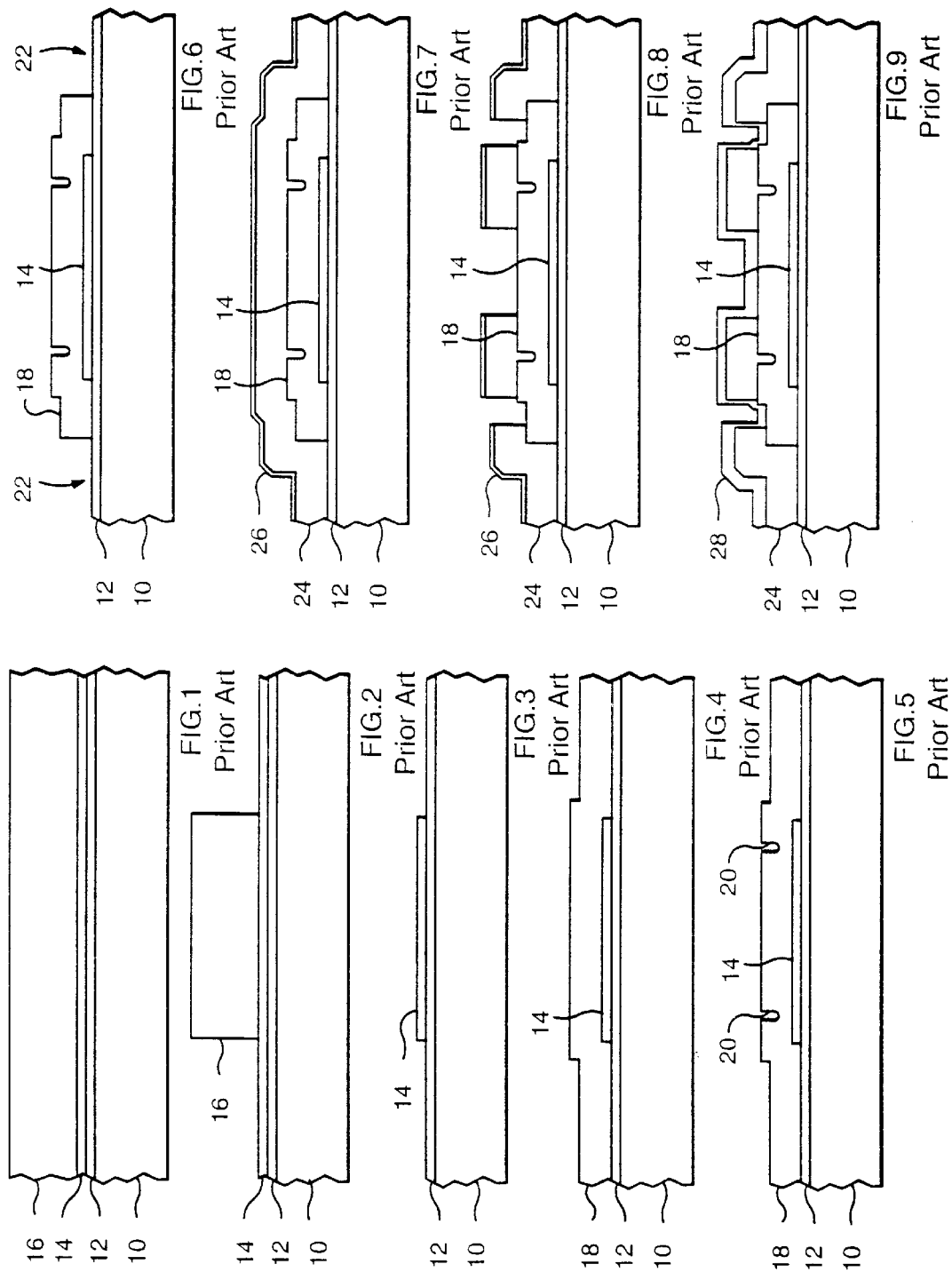

THERMAL OUT-OF-PLANE BUCKLE-BEAM ACTUATOR

FIELD OF THE INVENTION

The present invention relates to microelectromechanical system (MEMS) actuators and, in particular, to thermal microelectromechanical system actuators that are activated by Joule heating.

BACKGROUND AND SUMMARY OF THE INVENTION

Microelectromechanical system (MEMS) actuators provide control of very small components that are formed on semiconductor substrates by conventional semiconductor (e.g., CMOS) fabrication processes. MEMS systems and actuators are sometimes referred to as micromachined systems-on-a-chip.

One of the conventional MEMS actuators is the electrostatic actuator or comb drive. Commonly, such actuators include two comb structures that each have multiple comb fingers aligned in a plane parallel to a substrate. The fingers of the two comb structures are interdigitated with each other. Potential differences applied to the comb structures establish electrostatic interaction between them, thereby moving the comb structures toward and away from each other.

Advantages of the electrostatic actuator are that they require low current, which results in small actuation energy, and have a relatively high frequency response. Disadvantages are that they require high drive voltages (e.g., tens or hundreds of volts) and large areas and provide low output forces. Comb drive (electrostatic) actuators used for deployment of microstructures typically occupy many times the area of the device they are deploying. Also, the high voltages (e.g., tens or hundreds of volts) required to operate electrostatic actuators can be incompatible and prevent integration with conventional logic and low voltage electronics.

A pseudo-bimorph thermal actuator is an alternative to the electrostatic actuator. These actuators utilize differential thermal expansion of two different-sized polysilicon arms to produce a pseudo-bimorph that deflects in an arc parallel to the substrate. Such a thermal actuator produces much higher forces (100–400 times) per unit volume than comb drive actuators and can operate on very low voltages. Such actuators are limited to sweeping or arc motion in the plane of the actuator.

The present invention includes an out-of-plane thermal buckle-beam microelectrical mechanical actuator formed on a planar substrate of semiconductor material (e.g., silicon). The actuator includes first and second anchors secured to the substrate and multiple elongated thermal buckle beams that are secured between the anchors. The buckle beams are formed of semiconductor material, such as polysilicon. In one implementation, the buckling beams are coupled together by a pivot frame that includes a frame base secured to each buckle beam and at least one pivot arm that is coupled to the frame base at one end and includes a free end that pivots out-of-plane when the actuator is activated. A current source directs electrical current through the thermal buckle beams via the anchors to impart thermal expansion of the buckle beams and hence a buckling motion of them out of the plane (i.e., away from) the substrate. Some implementations may include an out-of-plane buckle bias that predisposes the buckle beams to move away from the substrate when activated.

Actuators according to the present invention provide out-of-plane motions with forces comparable to conventional thermal actuators. The resistivity of silicon allows the actuator to operate at voltages and currents compatible with standard integrated circuitry (e.g., CMOS). In addition, actuators according to the present invention are very small in area, have relatively high force. This electrically stimulated movement can be used in micro-motors, optical scanning devices, MEMS optical deployment mechanisms and other areas requiring mechanical movement on a micro scale.

Additional objects and advantages of the present invention will be apparent from the detailed description of the preferred embodiment thereof, which proceeds with reference to the accompanying drawings.

BRIEF DESCRIPTION OF THE DRAWINGS

FIGS. 1–15 are cross-section views of a general multi-user MEMS process known in the prior art for fabricating microelectrical mechanical devices. Cross-hatching is omitted to improve clarity of the prior art structure and process depicted.

DETAILED DESCRIPTION OF PREFERRED EMBODIMENTS

Figure 10:
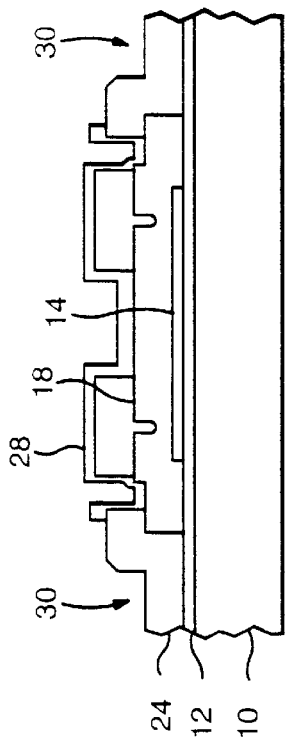

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers that separate layers and are removed during the process.

The accompanying figures show a general process for building a micro-motor as provided by the MEMS Technology Applications Center, 3021 Cornwallis Road, Research Triangle Park, N.C.

The MUMPs process begins with a 100 mm n-type silicon wafer 10. The wafer surface is heavily doped with phosphorus in a standard diffusion furnace using POCI 3 as the dopant source. This reduces charge feed-through to the silicon from electrostatic devices subsequently mounted on the wafer. Next, a 600 nm low-stress Low Pressure Chemical Vapor Deposition (LPCVD) silicon nitride layer 12 is deposited on the silicon as an electrical isolation layer. The silicon wafer and silicon nitride layer form a substrate.

Next, a 500 nm LPCVD polysilicon film—POLY 0 14—is deposited onto the substrate. The POLY 0 layer 14 is then patterned by photolithography; a process that includes coating the POLY 0 layer with a photoresist 16, exposing the photoresist with a mask (not shown) and developing the exposed photoresist to create the desired etch mask for subsequent pattern transfer into the POLY 0 layer (FIG. 2). After patterning the photoresist, the POLY 0 layer 14 is etched in a Reactive Ion Etch (RIE) system (FIG. 3).

With reference to FIG. 4, a 2.0 $\mu$m phosphosilicate glass (PSG) sacrificial layer 18 is deposited by LPCVD onto the POLY 0 layer 14 and exposed portions of the nitride layer 102. This PSG layer, referred to herein as a First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 20 in the First Oxide layer by RIE (FIG. 5) at a depth of 750 nm. The wafer is then patterned with a third mask layer, ANCHOR1, and etched (FIG. 6) to provide anchor holes 22 that extend through the First Oxide layer to the POLY 0 layer. The ANCHOR 1 holes will be filled in the next step by the POLY 1 layer 24.

After the ANCHOR1 etch, the first structural layer of polysilicon (POLY 1) 24 is deposited at a thickness of 2.0 $\mu$m. A thin 200 nm PSG layer 26 is then deposited over the POLY 1 layer 24 and the wafer is annealed (FIG. 7) to dope the POLY 1 layer with phosphorus from the PSG layers. The anneal also reduces stresses in the POLY 1 layer. The POLY 1 and PSG masking layers 24, 26 are lithographically patterned to form the structure of the POLY1 layer. After etching the POLY 1 layer (FIG. 8), the photoresist is stripped and the remaining oxide mask is removed by RIE.

After the POLY 1 layer 24 is etched, a second PSG layer (hereinafter "Second Oxide") 28 is deposited (FIG. 9). The Second Oxide is patterned using two different etch masks with different objectives.

First, a POLY1_POLY2_VIA etch (depicted at 30) provides for etch holes in the Second Oxide down to the POLY 1 layer 24. This etch provide a mechanical and electrical connection between the POLY 1 layer and a subsequent POLY 2 layer. The POLY1_POLY2_VIA layer is lithographically patterned and etched by RIE (FIG. 10).

Figure 11:
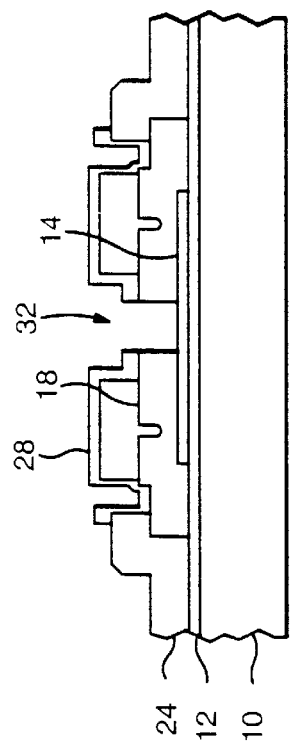
Figure 12:
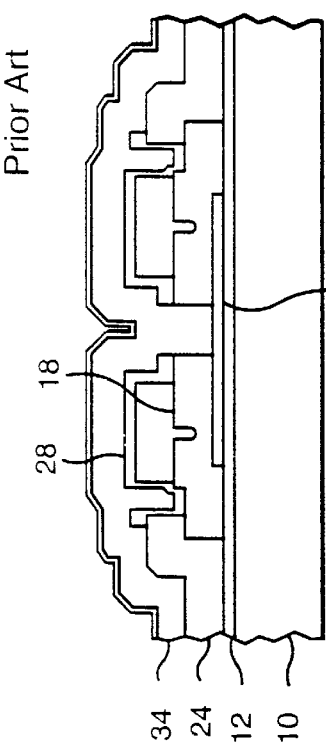

Second, an ANCHOR2 etch (depicted at 32) is provided to etch both the First and Second Oxide layers 18, 28 and POLY 1 layer 24 in one step (FIG. 11). For the ANCHOR2 etch, the Second Oxide layer is lithographically patterned and etched by RIE in the same way as the POLY1_POLY2_VIA etch. FIG. 11 shows the wafer cross section after both POLY1_POLY2_VIA and ANCHOR2 etches have been completed.

Figure 13:
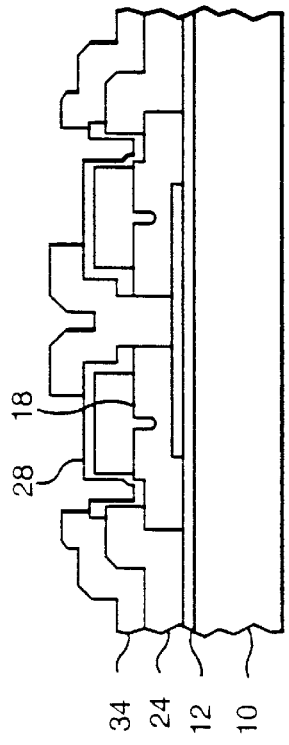

A second structural layer, POLY 2, 34 is then deposited at a thickness of 1.5 $\mu$m, followed by a deposition of 200 nm of PSG. The wafer is then annealed to dope the POLY 2 layer and reduce its residual film stresses. Next, the POLY 2 layer is lithographically patterned with a seventh mask and the PSG and POLY 2 layers are etched by RIE. The photoresist can then be stripped and the masking oxide is removed (FIG. 13).

Figure 14:
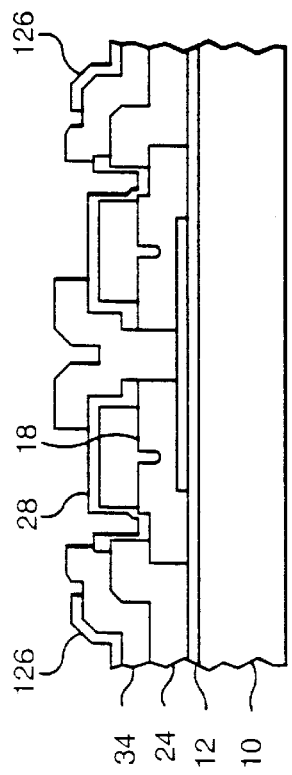

The final deposited layer in the MUMPs process is a 0.5 $\mu$m metal layer 36 that provides for probing, bonding, electrical routing and highly reflective mirror surfaces. The wafer is patterned lithographically with the eighth mask and the metal is deposited and patterned using a lift-off technique. The final, unreleased exemplary structure is shown in FIG. 14.

Figure 15:
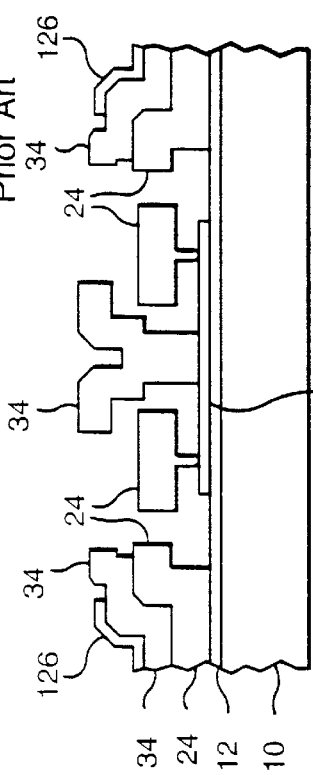

Lastly, the wafers undergo sacrificial release and test using known methods. FIG. 15 shows the device after the sacrificial oxides have been released.

In preferred embodiments, the device of the present invention is fabricated by the MUMPs process in accordance with the steps described above. However, the device of the present invention does not employ the specific mask patterns shown in the general process of FIGS. 1–15, but rather employs mask patterns specific to the structure of the present invention. Also, the steps described above for the MUMPs process may change as dictated by the MEMS Technology Applications Center. The fabrication process is not a part of the present invention and is only one of several processes that can be used to make the present invention.

Figure 16:
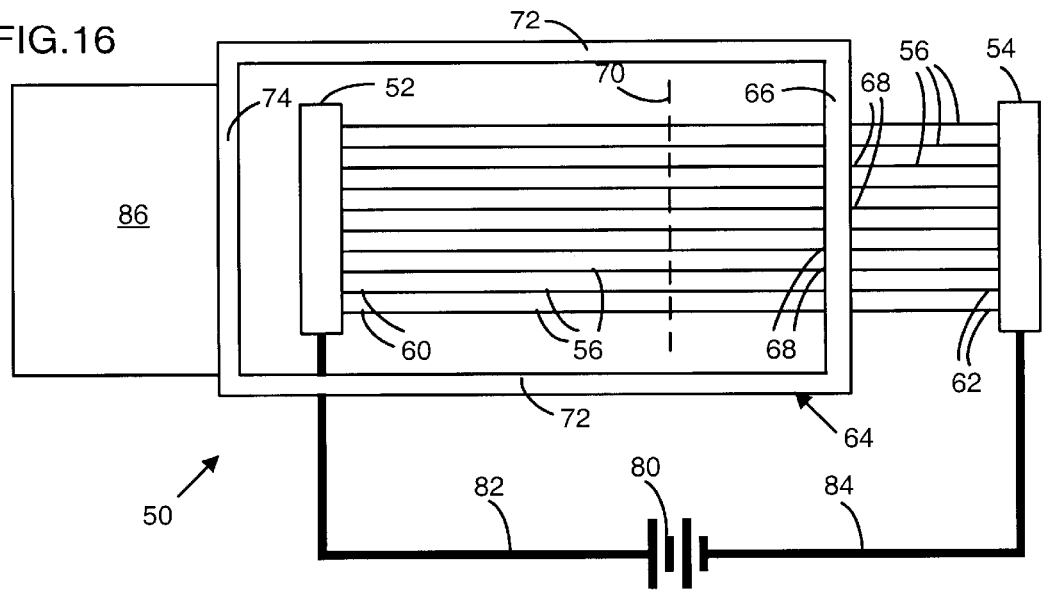
FIG. 16 is a diagrammatic plan view of a microelectrical mechanical out-of-plane thermal buckle-beam actuator according to the present invention.

FIG. 16 is a diagrammatic plan view of a microelectrical mechanical out-of-plane thermal buckle-beam actuator 50 according to the present invention. Actuator 50 includes a pair of structural anchors 52 and 54 that are secured to a substrate (e.g., substrate 10 or nitride layer 12, not shown) and one or more thermal buckle beams 56 (multiple shown) that are secured at their base ends 60 and 62 to anchors 52 and 54, respectively. Buckle beams 56 are substantially the same and extend substantially parallel to and spaced-apart from the substrate and are released from it other than at anchors 52 and 54.

Figure 17:
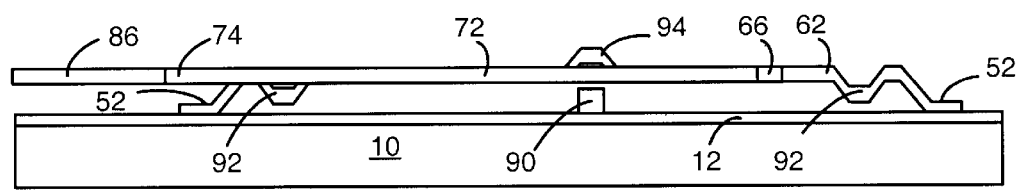
FIG. 17 is a diagrammatic side view of the actuator of FIG. 16 in a relaxed state.

A pivot frame 64 includes a frame base 66 that is secured to buckle beams 56 at coupling points 68 that in one implementation are positioned between buckle beam midpoints (indicated by dashed line 70) and one of anchors 52 and 54 (e.g., anchor 54). Pivot frame 64 further includes at least one pivot arm 72 (two shown) that is coupled to frame base 66 at one end and extends to a free end 74 that pivots out-of-plane when actuator 50 is activated. Pivot frame 64 is released and free to move, other than where frame base 66 is secured to coupling points 68. FIG. 17 is a diagrammatic side view of actuator 50 in a relaxed state illustrating pivot frame 64 as being generally parallel to or co-planar with buckle beams 56.

Figure 18:
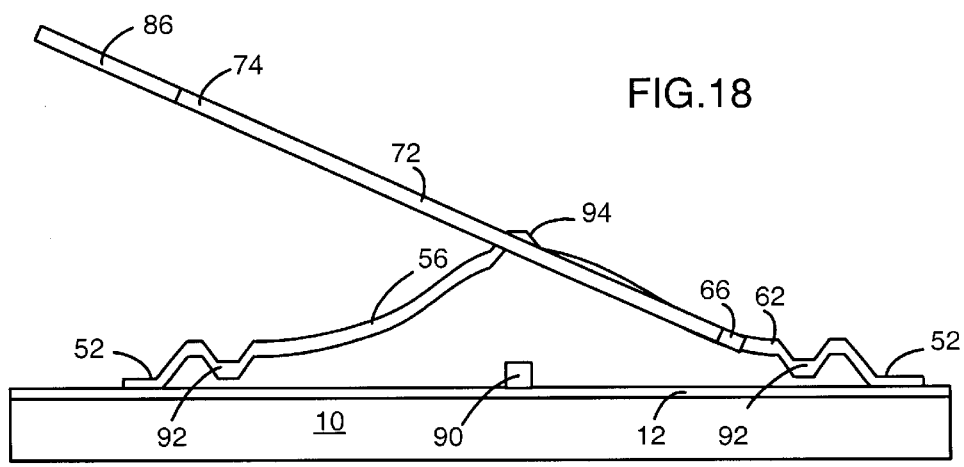
FIG. 18 is a diagrammatic side view of the actuator of FIG. 16 in an activated state.

Structural anchors 52 and 54 and buckle beams 56 have electrically semi-conductive and positive coefficient of thermal expansion properties. For example, buckle beams 56 are formed of silicon. Actuator 50 is activated when an electrical current is passed from a current source 80 through buckle beams 56 via electrically conductive couplings 82 and 84 and structural anchors 52 and 54, respectively. The applied current induces ohmic or Joule heating of buckle beams 56, thereby causing them to expand longitudinally due to the positive temperature coefficient of expansion of silicon. With anchors 52 and 54 constraining base ends 60 and 62 of buckle beams 56, the expanding buckle beams 56 ultimately buckle away from the substrate. In one implementation, buckle beams 56 are formed to have a widened aspect ratio, with widths (parallel to the substrate) greater than the thicknesses (perpendicular to the substrate), to provide a bias or predisposition for not buckling parallel to the substrate. For example, buckle beams 56 have a widened cross-sectional aspect ratio of 3:2, with widths of 3 $\mu$m, thicknesses of 2 $\mu$m, and lengths of 194 $\mu$m. FIG. 18 is a diagrammatic side view of actuator 50 in an activated state illustrating the out-of-plane buckling of buckle beams 56.

The buckling of buckle beams 56 away from the substrate in the active state of actuator 50 causes free end 74 of pivot frame 64 to pivot away from the substrate. Pivot frame 64 rotates about frame base 66, which is also raised away from the substrate by buckle beams 56. As a result, free end 74 moves and exerts a pivoting or rotational force outward away from the substrate. When the activation current ceases, buckle beams 56 cool and contract, which causes free end 74 of pivot frame 64 to return to its initial position. Such rotational deflections of pivot frame 64 may be used in a variety of applications, including providing out-of-plane deployment of other micro-mechanical structures, such as those used in micro-optical devices. In the implementation illustrated in FIGS. 16–18, for example, a mirror 86 is secured to free end 74 and pivots with pivot frame 64 to selectively deflect light according to whether actuator 50 is in its relaxed or activated state.

The widened aspect ratios of buckle beams 56 generally prevent them from buckling parallel to the substrate. Absent a bias or predisposition, the buckling of buckle beams 56 perpendicular to the substrate (e.g., FIG. 18) can arbitrarily occur away from or toward the substrate, the former being necessary for operation of actuator 50. Accordingly, FIGS. 19 and 20 illustrate bias structures that provide a bias or predisposition for buckle beam 56 to buckle away from the substrate, rather than toward it.

Figure 19:
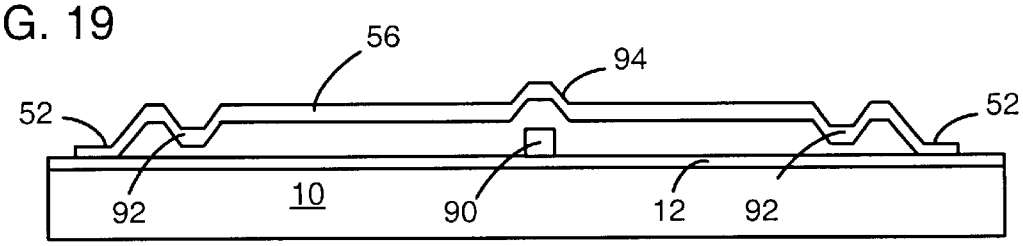
FIG. 19 is an enlarged side view illustrating a buckle beam in a relaxed state with bias structures that provide a bias or predisposition for the buckle beam to buckle away from the substrate.
Figure 20:
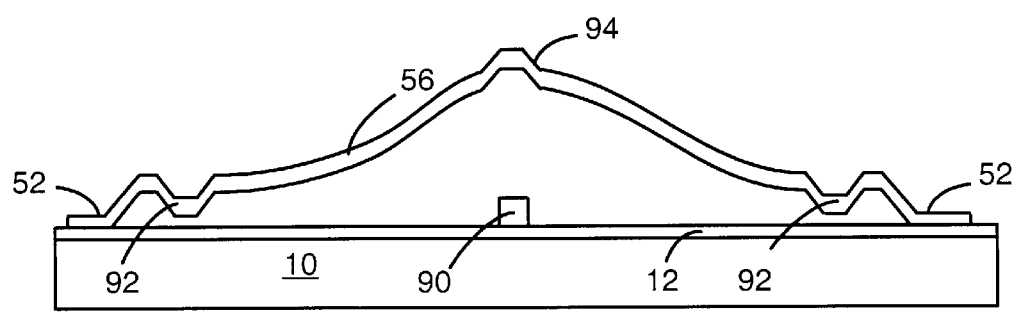
FIG. 20 is an enlarged side view illustrating a buckle beam in an actuated state with bias structures that provide a bias or predisposition for the buckle beam to buckle away from the substrate.

FIG. 19 is an enlarged side view showing an exemplary buckle beam 56 in a relaxed state extending over a spacing pad 90 that is secured to and extends from substrate 10 (e.g., the nitride layer 12) near the middle of buckle beam 56. No pivot frame is shown for purposes of clarity. FIG. 20 is an enlarged side view showing an exemplary buckle beam 56 in an activated state. For example, spacing pad 90 may be formed of a P0 layer with a thickness of 0.5 $\mu$m, and buckle beam 56 may be formed of a different (released) layer. Spacing pad 90 forces a small (e.g., 0.5 $\mu$m) hump or deflection 94 in each of buckle beams 56 due to the conformal nature of the fabrication. Also, a dimple 92 is formed near each end of buckle beam 56. Dimples 92 may be formed as a protrusion or dimple extending from a bottom surface of buckle beam 56 or as a recess into its top surface, or both, as illustrated. In a MUMPs implementation, for example, dimple 92 may be formed as is a 0.5 $\mu$m depression in the 2 $\mu$m poly1 layer and does not touch the substrate.

Spacing pad 90 and dimples 92 cause buckle beams 56 to buckle away from the substrate and reduce the stiction between buckle beams 56 and the substrate (e.g., the nitride layer 12). It will be appreciated that for the multiple buckle beams 56 in a typical actuator 50, a separate spacing pad 90 could be formed for each buckle beam 56 or spacing pad 90 could be formed as a single continuous pad that extends beneath all the buckle beams 56. Spacing pad 90 and dimples 92, either individually or together, could be used alone or with a widened aspect ratio for buckle beams 56 to provide a bias or predisposition for them to buckle away from the substrate.

Initial experiments have demonstrated that actuator 50 is capable providing pivoting or deflection of pivot frame 64 by at least about 15 degrees relative to the substrate. In one implementation, securing frame base 66 to coupling points 68 that are midway between the buckle beam midpoints and one of anchors 52 and 54 provides the greatest pivoting or deflection of pivot frame 64. Such coupling points 68 correspond to the inflection points in beams 56 when they are buckled and hence provide the greatest deflection of pivot frame 64.

Generally, the present invention is adaptable to any fabrication process that includes at least one releasable layer that has a positive temperature coefficient of expansion and is capable of carrying a current for ohmic heating. Moreover, there is no theoretical limit to the number of buckle beams 56 so long as the actuator and its associated conductors can handle the current and heat, the beams can lose heat rapidly. In one implementation, the heating temperature was kept below 800° C. to prevent self-annealing, which can cause irreversible damage.

Buckle beams 56, as well as anchors 52 and 54, can be fabricated out of either or both of the releasable MUMPs polysilicon layers, but with anchors 52 and 54 not being released. In such MUMPS implementations, actuator 50 can have possible thicknesses of 1.5, 2.0 or 3.5 $\mu$m. The resistivity of polysilicon allows the actuator to operate at voltages and currents compatible with standard integrated circuitry (e.g., CMOS). In addition, actuators according to the present invention are very small in area and have relatively high force.

In some modes of operation, mirror 86 and pivot frame 64 can form a pendulum that oscillates about frame base 66, which allows actuator 50 to operate as a resonant oscillator. In one implementation, such a resonant mode occurs at 14 kHz and provides a peak deflection of mirror 86 at about 25 degrees relative to the relaxed state. In this mode buckle beams 56 appear to assume a near-steady state buckled position, imparting a static deflection of mirror 86 and pivot frame 64. By contrast, in the non-resonant mode of this implementation actuator 50 has a half-amplitude response of about 2 KHz and a deflection of around 5 degrees.

Figure 21:
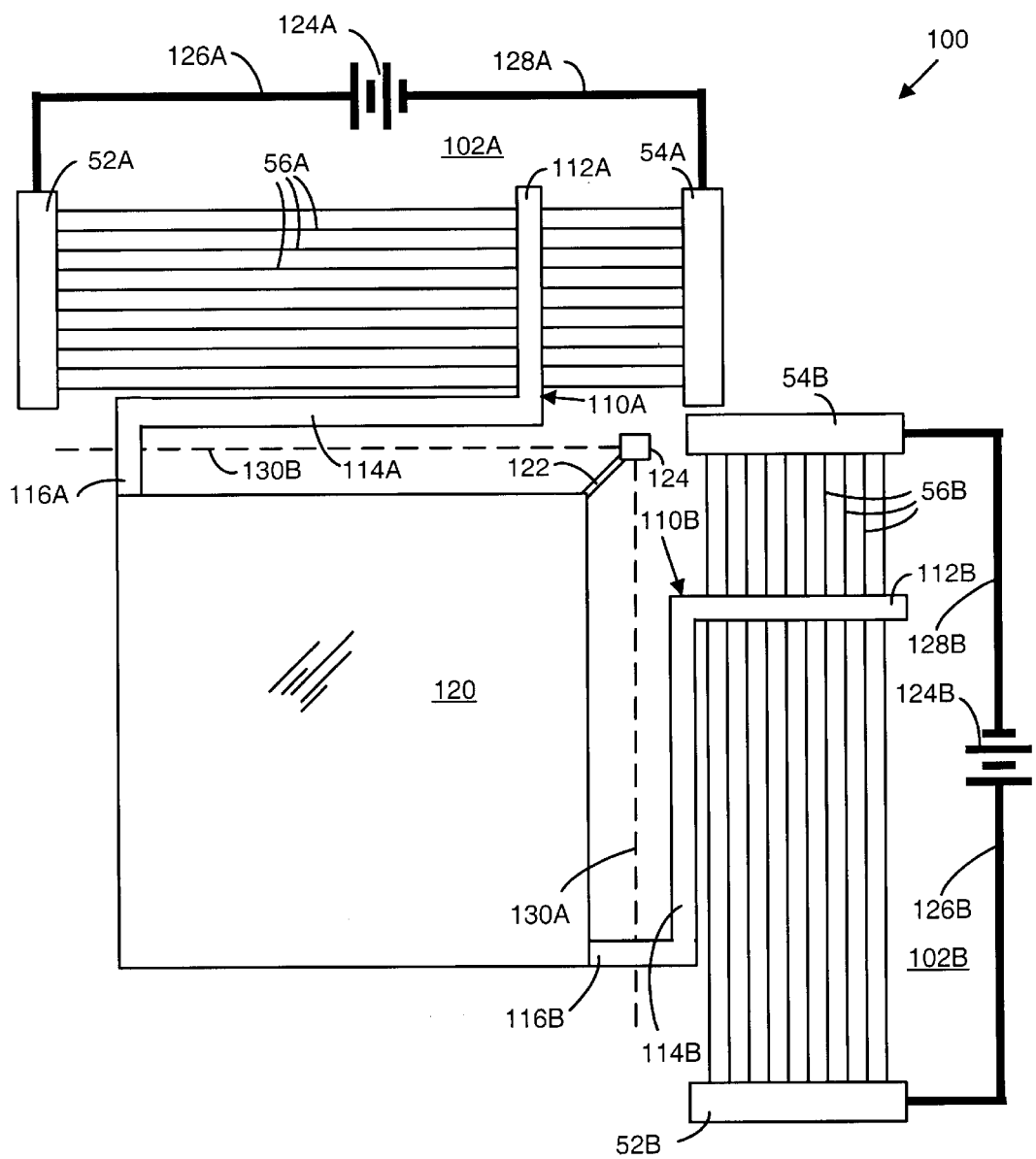
FIG. 21 is a diagrammatic plan view of an exemplary implementation of a microelectrical mechanical out-of-plane buckle-beam actuator assembly with multiple actuators.

FIG. 21 is a diagrammatic plan view of an exemplary implementation of a microelectrical mechanical out-of-plane buckle-beam actuator assembly 100 with multiple (e.g., two) actuators 102A, 102B that are positioned orthogonal to each other in alignment with adjacent sides of a rectangular (e.g., square) mirror 120. Actuators 102A, 102B are each analogous to actuator 50 described above, except that actuators 102A, 102B include pivot frames 110A, 110B that differ from pivot frame 64. Similarly, mirror 120 is analogous to mirror 86, but differs in its mounting and coupling to pivot frames 110A, 110B. The following description is directed to actuator 102A, but is similarly applicable to actuator 102B, with like components being indicated by the same reference numerals.

Actuator 102A includes a pair of structural anchors 52A and 54A that are secured to a substrate (e.g., substrate 10 or nitride layer 12, not shown) and multiple thermal buckle beams 56A that are secured at their base ends to anchors 52 and 54. A pivot frame 110A includes a frame base 112A that is secured to buckle beams 56A and one pivot arm 114A that is coupled to frame base 112A at one end and extends to a free end 116A that pivots out-of-plane when actuator 102A is activated. Free end 116A is attached to one corner of a mirror 120, which is linked by a tendon 122 to a mirror anchor 124 and is otherwise released from the substrate.

Actuator 102A is activated when an electrical current is passed from a current source 124A through buckle beams 56A via electrically conductive couplings 126A and 128A and structural anchors 52A and 54A, respectively. The applied current induces ohmic or Joule heating of buckle beams 56A, thereby causing them to expand longitudinally due to the positive temperature coefficient of expansion of silicon in the manner described above.

Actuators 102A and 102B function to tilt mirror 120 about tilt axes 130A and 130B, respectively. Actuators 102A and 102B with respective current sources 124A and 124B may be operated separately to tilt mirror 120 arbitrarily about tilt axes 130A and 130B. With coordinated operation, actuator assembly 100 and mirror 120 may be employed as a scan control mirror in a bar code or vector image scanner or to provide a raster scan pattern for image formation.

Parts of the description of the preferred embodiment refer to steps of the MUMPs fabrication process described above. However, as stated, MUMPs is a general fabrication process that accommodates a wide range of MEMS device designs. Consequently, a fabrication process that is specifically designed for the present invention will likely include different steps, additional steps, different dimensions and thickness, and different materials. Such specific fabrication processes are within the ken of persons skilled in the art of photolithographic processes and are not a part of the present invention.

In view of the many possible embodiments to which the principles of our invention may be applied, it should be recognized that the detailed embodiments are illustrative only and should not be taken as limiting the scope of our invention. Rather, I claim as my invention all such embodiments as may come within the scope and spirit of the following claims and equivalents thereto.

What is claimed is:

1. A thermal microelectrical mechanical actuator, comprising:
   a planar substrate with first and second anchors secured thereto;
   one or more elongated thermal buckle beams that each have first and second ends secured to the first and second anchors, respectively;
   an out-of-plane buckle bias that predisposes the buckle beams to move away from the substrate when activated; and
   electrical couplings to direct electrical current through the thermal buckle beams via the anchors to impart thermal expansion of the thermal buckle beams and motion of them away from the substrate, thereby to activate the actuator.

2. The actuator of claim 1 further comprising a pivot frame that includes a frame base secured to each buckle beam and at least one pivot arm that is coupled to the frame base at one end and includes a free end that pivots out-of-plane when the actuator is activated.

3. The actuator of claim 2 in the pivot frame includes two pivot arms that have their free ends joined so that they pivot together when the actuator is activated.

4. The actuator of claim 1 in which each of the one or more buckle beams has a midpoint, the actuator further comprising a pivot frame that includes a frame base secured to each buckletbeam between its midpoint and one of the anchors and includes at least one pivot arm that is coupled to the frame base at one end and includes a free end that pivots out-of-plane when the actuator is activated.

5. The actuator of claim 4 in which the frame base is secured to each buckle beam about midway between its midpoint and the one of the anchors.

6. The actuator of claim 4 in which the pivot arm supports an optical reflector.

7. The actuator of claim 1 in which the out-of-plane buckle bias includes the buckle beams having a widened aspect ratio in which each buckle beam has a width parallel to the substrate and a thickness perpendicular thereto, the width of each buckle beam being greater than its thickness.

8. The actuator of claim 1 in which the out-of-plane buckle bias includes a spacing pad extending from the substrate under each buckle beam.

9. The actuator of claim 7 in which the spacing pad is formed as a single structure that extends under every buckle beam of the actuator.

10. The actuator of claim 1 in which each of the one or more buckle beams has a midpoint and in which the out-of-plane buckle bias includes a spacing pad extending from the substrate under about the midpoint of each buckle beam.

11. The actuator of claim 1 in which the out-of-plane buckle bias includes a dimple formed near each end of each buckle beam.

12. A thermal microelectrical mechanical actuator, comprising:
   a planar substrate with first and second anchors secured thereto;
   one or more elongated thermal buckle beams that each have first and second ends secured to the first and second anchors, respectively;
   a pivot frame that includes a frame base secured to each buckle beam and at least one pivot arm that is coupled to the frame base at one end and includes a free end that pivots out-of-plane when the actuator is activated; and
   electrical couplings to direct electrical current through the thermal buckle beams via the anchors to impart thermal expansion of the thermal buckle beams and motion of them away from the substrate, thereby to activate the actuator.

13. The actuator of claim 12 in the pivot frame includes two pivot arms that have their free ends joined so that they pivot together when the actuator is activated.

14. The actuator of claim 12 in which each of the one or more buckle beams has a midpoint and the frame base is secured to each buckle beam between its midpoint and one of the anchors.

15. The actuator of claim 14 in which the frame base is secured to each buckle beam about midway between its midpoint and the one of the anchors.

16. The actuator of claim 12 further comprising an out-of-plane buckle bias that predisposes the buckle beams to move away from the substrate when activated, the out-of-plane buckle bias including the buckle beams having a widened aspect ratio in which each buckle beam has a width parallel to the substrate and a thickness perpendicular thereto, the width of each buckle beam being greater than its thickness.

17. The actuator of claim 12 further comprising an out-of-plane buckle bias that predisposes the buckle beams to move away from the substrate when activated, the out-of-plane buckle bias including a spacing pad extending from the substrate under each buckle beam.

18. The actuator of claim 17 in which the spacing pad is formed as a single structure that extends under every buckle beam of the actuator.

19. The actuator of claim 12 further comprising an out-of-plane buckle bias that predisposes the buckle beams to move away from the substrate when activated, the out-of-plane buckle bias including a dimple formed near each end of each buckle beam.

20. A thermal microelectrical mechanical actuator, comprising:
   a planar substrate with first and second anchors secured thereto;
   plural substantially identical elongated thermal buckle beams that each have first and second ends secured to the first and second anchors, respectively;
   a coupling between the buckle beams that moves out-of-plane when the actuator is activated; and
   electrical couplings to direct electrical current through the thermal buckle beams via the anchors to impart thermal expansion of the thermal buckle beams and motion of them away from the substrate, thereby to activate the actuator.

21. The actuator of claim 20 in which the coupling includes a pivot frame that includes a frame base secured to each buckle beam and at least one pivot arm that is coupled to the frame base at one end and includes a free end that pivots out-of-plane when the actuator is activated.

22. The actuator of claim 21 further comprising an out-of-plane buckle bias that predisposes the buckle beams to move away from the substrate when activated.

23. The actuator of claim 20 further comprising an out-of-plane buckle bias that predisposes the buckle beams to move away from the substrate when activated.

* * * * *